United States Patent
Morimoto et al.

(10) Patent No.: US 6,842,582 B2
(45) Date of Patent: Jan. 11, 2005

(54) LIGHT HEATING APPARATUS AND METHOD THEREFOR

(75) Inventors: Yukihiro Morimoto, Hyogo (JP); Tetuya Torikai, Hyogo (JP); Takafumi Mizoziri, Hyogo (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/601,563

(22) Filed: Jun. 24, 2003

(65) Prior Publication Data

US 2004/0008980 A1 Jan. 15, 2004

(30) Foreign Application Priority Data

Jun. 25, 2002 (JP) .................................. 2002-184226

(51) Int. Cl.⁷ .............................................. F26B 19/00
(52) U.S. Cl. ...................... 392/416; 392/418; 219/390; 219/405; 219/411; 118/724; 118/725; 118/50.1
(58) Field of Search .................................. 219/390, 405, 219/411; 392/416, 418; 118/724, 725, 50.1

(56) References Cited

U.S. PATENT DOCUMENTS 5,073,698 A * 12/1991 Stultz .......................... 219/405
6,614,005 B1 * 9/2003 Walk et al. .................. 219/390

* cited by examiner

*Primary Examiner*—Shawntina Fuqua
(74) *Attorney, Agent, or Firm*—Rader, Fishman & Grauer PLLC

(57) ABSTRACT

In a light heating apparatus having a flash lamp in which noble gas is enclosed, a casing surrounding the flash lamp, a stage where a silicon wafer on which light from the flash lamp is emitted is placed, and a power feeding apparatus for controlling light emission of the flash lamp, B/A is greater than 1.0 wherein integrated radiant intensity in a range from 220 to 370 nm wavelength is represented as A and integrated radiant intensity in a range from 370 to 800 nm wavelength.

10 Claims, 4 Drawing Sheets

FIG. 5

| B/A | Total Number of wafers used in the experiment | Light-transmitting member is inserted (The number of cracked wafers) | Light-transmitting member is not inserted (The number of cracked wafers) |
|---|---|---|---|
| 0.8 | 25 | 8 | 14 |
| 0.9 | 25 | 5 | 12 |
| 1.0 | 25 | 0 | 3 |
| 1.3 | 25 | 0 | 2 |
| 3.0 | 25 | 0 | 2 |
| 5.0 | 25 | 0 | 6 |

LIGHT HEATING APPARATUS AND METHOD THEREFOR

TECHNICAL FIELD OF THE INVENTION

This invention relates to a light heating apparatus and a method therefor, especially a light heating apparatus and a method for rapidly heat-treating a substrate such as a silicon wafer(s) by light emission.

DESCRIPTION OF RELATED ART

A light emission type heating apparatus for heating a substrate such as a silicon wafer(s) by light emission is known.

In a semiconductor manufacturing process, the wafer is rapidly heated, kept at a high temperature, and then rapidly cooled down. The process may include formation of film (forming an oxidized file on the wafer surface) and diffusion (diffusing impurities inside the wafer).

In the diffusion process, the impurities are introduced in the silicon crystal in the surface portion of the silicon wafer by ionic implantation, and the impurities are diffused by heat-treating the silicon wafer, for example, at more than 1000° C., thereby, impurity diffusion layer on the surface portion of the silicon wafer is formed.

A rapid thermal process (RTP) in which a lamp is used as a light source to heat-treat such silicon wafer is known. In the rapid thermal process, the silicon wafer is rapidly heated by emitting light from the light source on the silicon wafer(s) and then cooling down the silicon wafer(s). A halogen lamp is known as a heating source for such an apparatus.

However, in recent years, high integration and miniaturization of a semiconductor integrated circuit is increasingly desired. Therefore, it is necessary to form a thin impurity diffused layer at a level of, for example, 20 nm. In such an apparatus that uses a halogen lamp as a heating source, it is difficult to sufficiently meet the needs.

A method for achieve impurity diffusion in a extremely thin area, in which a silicon wafer is heat-treated by scanning the silicon wafer with laser light having a width of a couple of millimeters, using laser emission (XeCL) is known.

However, such an apparatus that uses laser is very expensive and there is a problem in terms of throughput since the silicon wafer is heat-treated by scanning with a laser beam spot having a small diameter on the surface of the silicon wafer.

As a light source, a method for heating a silicon wafer for an extremely short time wherein a flash lamp is used has been proposed. In the heat-treating method by such a flash lamp, there is a big advantage that it is possible to decrease the temperature of the silicon wafer, and light emission time is extremely short. However, there is a problem that the silicon wafer is cracked when or after the silicon wafer is heat-treated by the flash lamp.

SUMMARY OF THE INVENTION

A discharge lamp in which noble gas such as xenon is enclosed emits a consecutive radiant spectrum over the entire wavelength band, 220 nm to 800 nm. The broadband consecutive radiant spectrum light is emitted onto the work piece, that is, the silicon wafer.

The inventors turned their attention to the facts that a silicon wafer has different light wavelength absorption characteristic in a depth direction (a thickness direction), and light wavelength spectrum range of wavelength of light which reaches inside the silicon wafer, subtly differs depending on a portion of the silicon wafer in the thickness direction.

There are light of wavelength range (short wavelength light) that intensely heats the silicon wafer to tens of nanometer depth from the surface of the silicon wafer and light of wavelength range (long wavelength light) that heats the silicon wafer deeper than that.

It is presumed that when component of light that heats a portion near the surface of the silicon wafer is too much, the temperature distribution (temperature gradient) in the thickness direction of the silicon wafer becomes steep, which causes cracks on the silicon wafer.

The inventors discovered that the problem that the silicon wafer is cracked is solved well by adjusting ratio of light component absorbed in the portion near the surface and that absorbed in the portion deeper than that.

Light emitted from the flash lamp is emitted onto a stage surface of the silicon wafer through an airtight light-transmitting member and the light emission energy density on the stage surface is more than 20 J/cm$^2$.

In a light heating process in which a large energy (that is, the light emission energy density is more than 20 J/cm$^2$ on the stage surface) is used, it was found that in addition to the problem that the silicon wafer is cracked because of light absorption difference in the thickness direction of the silicon wafer, the silicon wafer is affected by a shock wave caused by lamp emission.

Instead of directly emitting light from the flash lamp, by passing the light through the airtight light-transmitting member, the light transmitting member functions to block the shock wave, thereby reducing the effect thereof.

The airtight light-transmitting member is defined as a member having a spatially dividing structure in the light-transmitting portion of a plate shaped member such as quartz glass. It does not mean a light-transmitting member such as a mesh or slit having spatial communication.

It is an object of the present invention to prevent a silicon wafer from being cracked.

According to the present invention, a light heating apparatus has a flash lamp, a casing surrounding the flash lamp, a stage where a substrate is placed, and a power feeding apparatus for controlling emission of light from the flash lamp, wherein B/A is greater than 1.0 wherein integrated radiant intensity of the light in a range of 220 to 370 nm wavelength is represented as A and integrated radiant intensity of the light in a range of 370 to 800 nm wavelength.

In the light heating apparatus, the light from the flash lamp may be emitted on the substrate through a light-transmitting member.

Further, the light heating apparatus may include a preheating lamp.

Furthermore, in the light heating apparatus, the light-transmitting member may be airtight.

In the light heating apparatus, light emission density on the surface of the stage may be more than 20 J/cm$^2$.

Further, according to the present invention, a light heating apparatus comprises a flash lamp that emits light on a substrate, and a stage where the substrate is placed, wherein B/A is greater than 1.0 wherein integrated radiant intensity of the light in a range of 220 to 370 nm wavelength is represented as A and integrated radiant intensity of the light in a range of 370 to 800 nm wavelength is represented as B.

Furthermore, according to the present invention, a method for emitting light on a substrate, comprising the steps of placing the substrate on a predetermined place and emitting light on the substrate, wherein B/A is greater than 1.0 wherein integrated radiant intensity of the light in a range of 220 to 370 nm wavelength is represented as A and integrated radiant intensity of the light in a range of 370 to 800 nm wavelength.

In the step of emitting light on the substrate, the light may pass through a light-transmitting member.

In the method for emitting light on the substrate, light emission density on the substrate may be more than 20 $J/cm^2$.

The method for emitting light on the substrate may include a step of pre-heating the substrate.

DESCRIPTION OF THE DRAWINGS

The present inventions will now be described by way of example with reference to the following figures in which:

FIG. 5 is a chart showing results of experiment wherein the intensity ratio is measured, changing parameters.

DETAILED DESCRIPTION OF THE INVENTION

Figure 1:
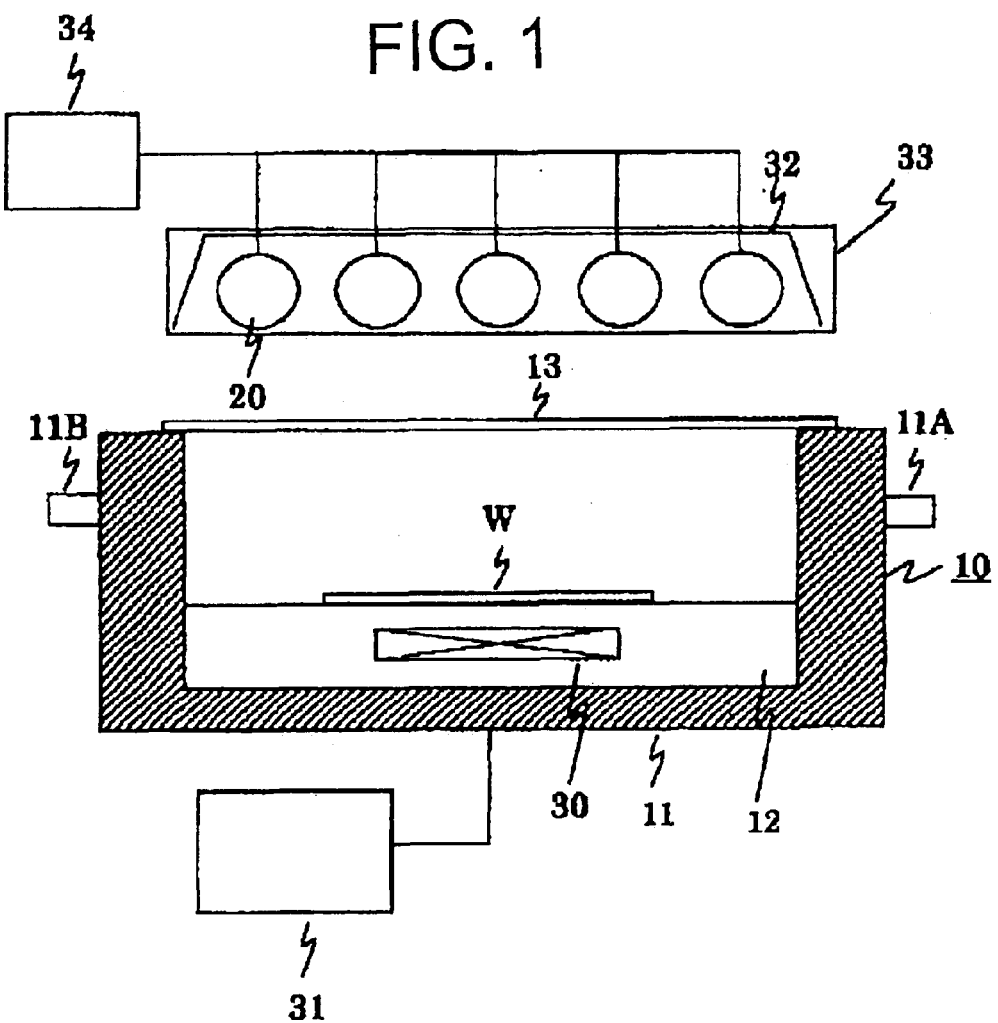
FIG. 1 is a schematic view of a light heating apparatus according to the present invention.

FIG. 1 shows a schematic view of a light heating apparatus according to the present invention.

The light heating apparatus 10 treats a silicon wafer W as a work piece. The light heating apparatus 10 has a quartz glass chamber 11 having an atmosphere gas introducing port 11A, and a discharging port 11B, a stage 12 for supporting a silicon wafer positioned in the chamber 11. A quartz glass plate 13 is provided as the airtight light-transmitting member on the ceiling surface of the chamber 11 (upper surface in FIG. 1).

Above the light-transmitting member 13, a flash lamps 20 are provided as a heat source. Below the chamber 11, a halogen heater lamp 30 is provided as a preliminary heating unit. The heater lamp 30 is buried in the stage 12 and the temperature of the heater lamp 30 is controlled by the chamber controller 31. The chamber controlling circuit 31 controls the stage to ascend and descend and also controls the atmosphere gas introducing port 11A and the gas discharging port 11B to open and close.

In the light heating apparatus, when the silicon wafer W to which impurities have been introduced is carried in the chamber 11, flash irradiation heat treatment to the silicon wafer W is carried out by flashing the flash lamps 20 after the silicon wafer(s) is pre-heated up to a temperature at which heat diffusion of the impurities does not become a problem, by the halogen heater lamp 30.

By such heat treatment, the surface layer portion of the silicon wafer W is rapidly heated up to a high temperature and then cooled down. After that, the silicon wafer is discharged from the chamber 11. The pre-heating is desirable to reduce temperature gradient in the direction of thickness of the silicon wafer. Also such pre-heating is desirable to minimize energy, which is applied to the lamp, for increasing temperature on the light exposed area to a desired level. The temperature for heating the silicon wafer is selected from a range of 300 to 1300° C. (E.g. 350° C.).

During the heat treatment, the temperature on the silicon wafer surface during heat processing by the heater lamp 30 and the flash lamp 20 reaches more than 1000° C. More specifically, the silicon wafer is treated at between 1000° C. and 1300° C.

Thus, it is possible to certainly form impurity diffusion layer in the surface portion of the silicon wafer by heating the silicon wafer at a maximum temperature of more than 1000° C.

The flash lamps 20 are provided in parallel to each other at even intervals along with the light-transmitting member 13. The flash lamps 20 are covered by a common reflecting mirror 32. The common reflecting mirror 32 is disposed in a casing 33. A lighting operation of each flash lamp 20 is controlled by a power feeding apparatus 34.

In this embodiment, the casing 33 enclosing the flash lamps 20 has an opening on the light emission side. However, it is possible to provide a light-transmitting member so as to cover the opening.

Figure 2:
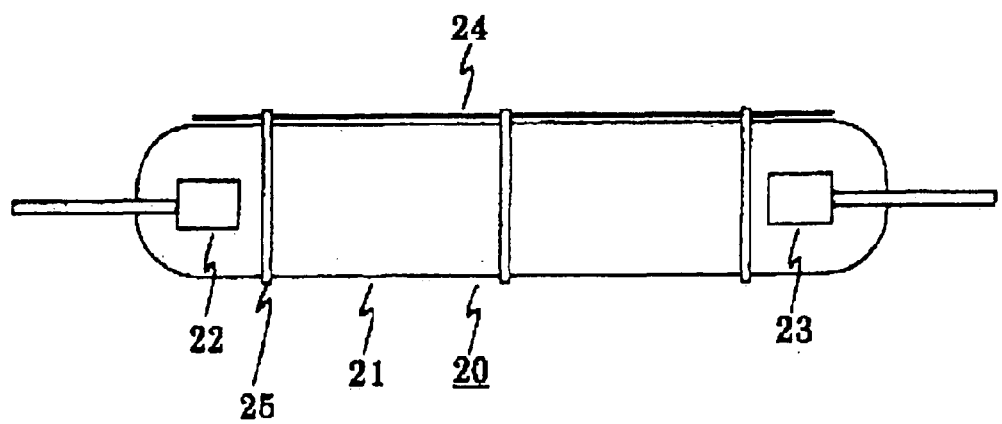
FIG. 2 shows a schematic view of one of flash lamps.

FIG. 2 shows a schematic view of one of the flash lamps 20.

In a straight tube type quartz glass discharge container 21, for example, xenon gas is enclosed. Both ends of the quartz glass discharge container are sealed and a discharge space is defined inside the discharge container. In the discharge space, an anode 22 and a cathode 23 are facing each other. A trigger electrode 24 is held in a longitudinal direction on the outside surface of the discharge container 21 by a trigger band 25.

As an example of specification of the flash lamp 20, an internal diameter of the discharge container is selected from a range of φ8–15 mm, for example, 10 mm. The length of the discharge container is selected from a range of 200–550 mm, for example, 300 mm. The enclosed amount of xenon is selected from a range of 200 and 1500 torr, for example, 500 torr. The main luminescent component may include but not limited to xenon gas. Argon gas or krypton gas may be used as the main luminescent component instead of the xenon gas. Further, it is possible to add other materials such as mercury to the xenon gas.

The electrodes are a sintered electrode having a diameter selected from a range of 4 to 10 mm, for example 5 mm and a 5 to 9 mm length, for example, 7 mm.

The main component of the electrodes is tungsten. The distance between electrodes is selected from a range of 160 to 500 mm, for example, 280 mm. Barium monoxide (BaO), calcium oxide (CaO), strontium oxide (SrO), alumina (Al2O3) etc. are mixed in the cathode as an emitter.

A trigger electrode is a nickel or tungsten wire and is in contact with the discharge container.

Figure 3:
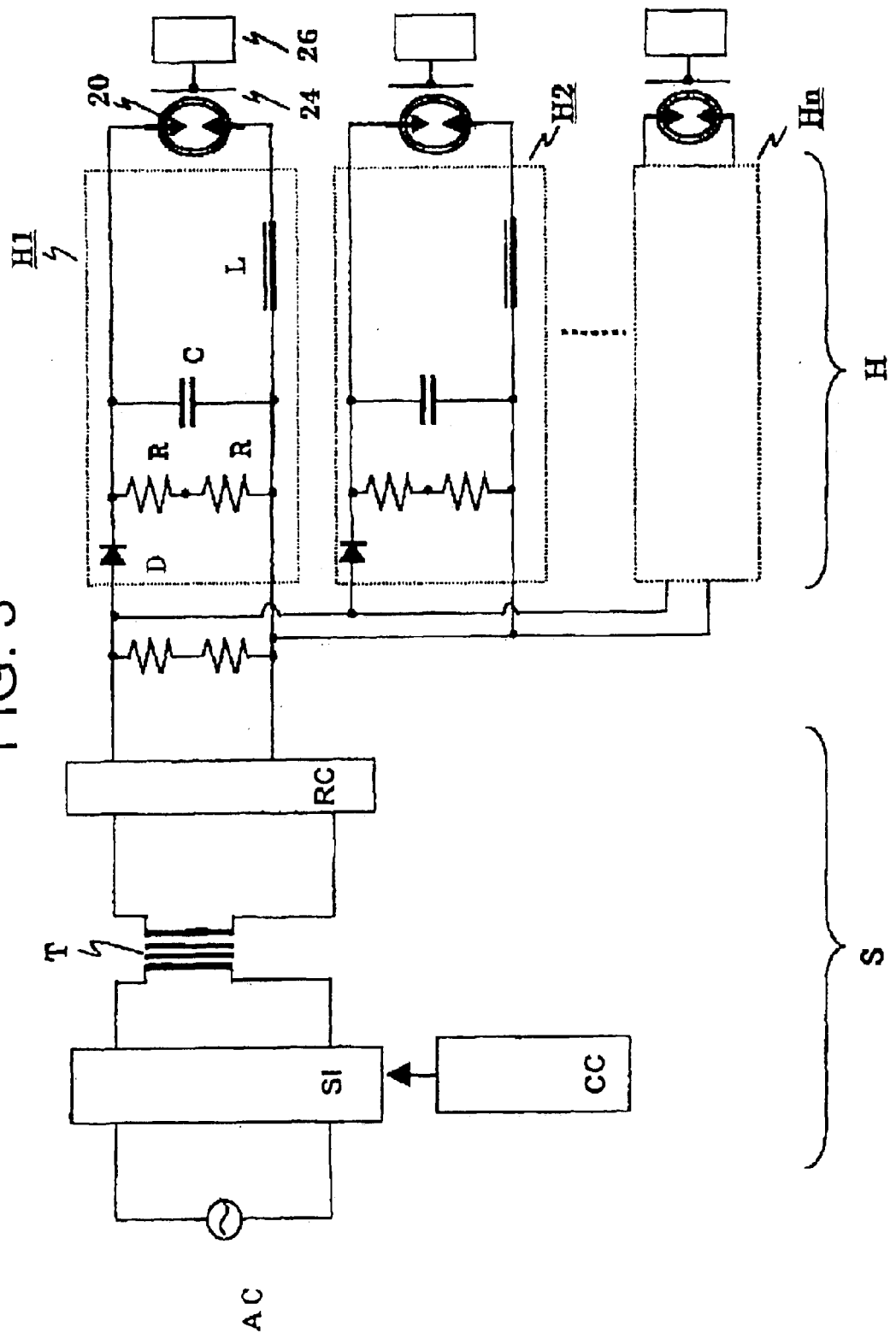
FIG. 3 is a schematic view of a lamp lighting circuit of the power feeding apparatus shown in FIG. 1 wherein a charging circuit S common to the plurality of flash lamps 20 and a flash circuit H corresponding to each flash lamp are shown.

FIG. 3 shows a lamp lighting circuit of the power feeding apparatus shown in FIG. 1 wherein a charging circuit S common to the plurality of flash lamps 20 and flash circuits H, each of which corresponds to each flash lamp are provided.

The charging circuit S, connected to an AC power supply, comprises a switching inverter circuit SI, a transformer T, a rectification circuit RC, and a controlling circuit CC for the inverter circuit SI. The flash circuits H (H1, H2, . . . Hn), each of which is provided for a respective flash lamp, is connected to the rectification circuit on the output side of the rectification circuit. Each of the flash circuits H comprises a back-flow prevention diode D, a voltage detection resistance circuit R, a main condenser C and a choke coil L. Each of the flash lamps 20 is connected to the corresponding flash circuit H.

Each of flash lamps 20 is provided together with a trigger electrode 24 which is connected to a corresponding trigger circuit 26.

Twenty (20) to thirty (30) flash lamps and flash circuits are provided.

In such a power feeding apparatus, the main condenser C of each flash circuit H is charged through the inverter circuit. When the main condenser C is sufficiently charged, an electric field is induced, using the quartz glass discharge container as dielectric, by voltage impressed by the trigger electrode 24. Based on this, the energy stored in the main condenser C is discharged at a stretch and flashing light is emitted.

Each flash circuit H detects charged voltage of the main condenser C and when charge of all the condensers is completed, voltage is impressed to all the trigger electrodes at the same time, thereby, the flash lamps 20 are flashed at the same time.

Thus, as an example of specification of flash by the flash lamps, charge and discharge of the main condensers are repeated at a rate of 0.5 to 2 times per minute, for example, once per minute.

In the main condensers C, for example, 2000 to 5000 V (represented as 1,200 to 7,500 J in form of energy), for example, 4,500 V (represented as 6,000 J in form of energy) is charged and discharged from the main condenser, and applied to each flash lamp.

The number of the flash lamps, as described above, is 5 to 30, for example 10. The light intensity on the light exposed surface is selected from a range of 10 to 50 J/cm$^2$, for example 20 J/cm$^2$ in case of the number of the flash lamps is 5 to 30.

Figure 4:
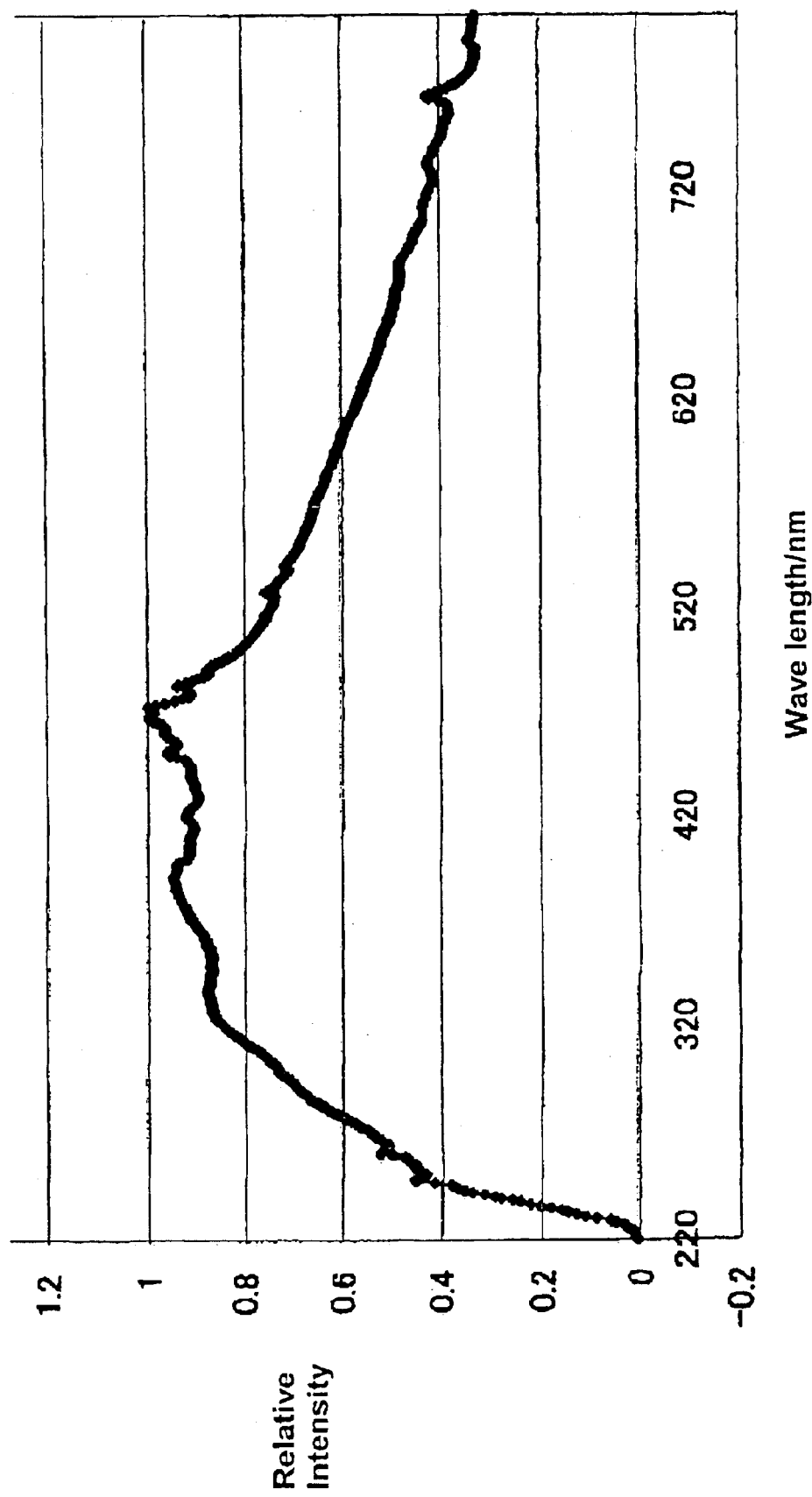
FIG. 4 is a graph showing radiant spectrum on the surface of the silicon wafer on the stage.

FIG. 4 is a graph showing radiant spectrum on the surface of the silicon wafer on the stage.

The vertical axis shows relative radiant intensity to intensity of wavelength 500 nm and the horizontal axis shows wavelength (nm).

In the present invention, light having 220 nm to 370 nm wavelength is called short-wavelength light and light having 370 to 800 nm wavelength is called long-wavelength light. Absorption amount of short-wavelength light and long-wavelength light in the thickness direction of the silicon wafer W differs from each other.

The light having 220 nm to 370 nm wavelength heats a thin portion near the surface of the silicon wafer W with high light intensity. On the other hand, the light having 370 nm to 800 nm heats 400 nm depth portion from the surface of the silicon wafer W with high intensity of the same degree (comparing to the short-wavelength, light) as that of the light having 220 nm to 370 nm wave length.

The thickness of the silicon wafer W is about 725 $\mu$m. To activate the impurities introduced by ionic plantation etc., the silicon wafer W must be heated to the depth of about 100 nm.

The present inventors discovered, based on the characteristic of silicon wafer heating, that the problem of silicon wafer cracking and unbalanced heating in the direction of thickness of the silicon wafer W are solved well by adjusting intensity ratio between the short-wavelength light and long-wavelength light in the range of 220 nm to 800 nm wavelength, which are emitted from the flash lamps.

Next, an experiment to prove cause-effect relationship between intensity ratio between the long wavelength light/short wavelength light intensity ratio and silicon wafer cracks is explained below.

In the experiment, using the apparatus having approximately the same structure as that shown in FIG. 1, but using one flash lamp as a matter of convenience, intensity ratio between short-wavelength light and long wavelength light were changed.

As the specification of the experiment, 4 inch diameter and 725 $\mu$m thickness silicon wafer was placed on the stage where the heater was built in, and heated to about 350° C.

A flash lamp used in the experiment had 160 mm distance between the electrodes and 10 mm internal diameter. The discharge container containing xenon gas as a main luminescent component was used.

Under these conditions, the structure and materials of arc tube were individually changed respectively and thereby the intensity ratio between the short-wavelength area light and long-wavelength area light were changed. Specifically, the arc tube material was quartz glass containing titanium oxide ($TiO_2$) and cerium oxide ($CeO_2$) and the content was changed in the range of over ten to several hundreds ppm.

As described above, the internal diameter was 10 mm but glass tube thickness was changed.

The short wavelength area light is defined as light having 220 nm to 370 nm wavelength, the integrated radiant intensity of which is represented as A.

The long wavelength area light is defined as light having 370 nm to 800 nm wavelength, the long wavelength area light of which is represented as B.

To measure the light intensity, an optical fiber was used. The end surface of the optical fiber was placed in and directed toward the lamp. The light entering in the end surface of the optical fiber was light-guided to an instantaneous spectrum radiometer by the optical fiber. The light intensity was measured with 0.5 nm wavelength resolution and time resolution 5 msec.

The integrated radiant intensity is an integrated value of radiant intensity in the range of each wavelength and a total value of flash emission per flash was measured.

It was examined whether the silicon wafer was cracked when the radiant intensity B/A was 0.8, 0.9, 1.0, 1.3, 3.0 and 5.0 respectively wherein the integrated radiant intensity in the short wavelength area in the range from 220 nm to 370 nm wavelength was represented as A and the integrated radiant intensity in the long wavelength area in the range from 370 nm to 800 nm wavelength was represented as B.

Also, it was examined whether the silicon wafers were cracked in case that a window member (a light-transmitting member) was inserted between the flash lamp and the silicon wafer and in case that it was not inserted.

Under each condition, it was examined how many silicon wafers were cracked among 25 silicon wafers.

In FIG. 5, the results of experiment are shown.

When the window member is inserted between the flash lamp and the silicon wafer and the radiant intensity ratio B/A is 1.0, 1.3, 3.0, or 5.0, no silicon wafer out of the 25 silicon wafers was cracked. On the other hand, when the radiant intensity ratio B/A was 0.8, 8 silicon wafers were cracked and when the radiant intensity ratio B/A was 0.9, 5 silicon wafers were cracked.

According to the experiment, when the radiant intensity ratio B/A is 1.0 or greater, it is possible to heat the silicon wafer with temperature gradient which is gradual enough not to create stress in the thickness direction of the silicon wafer. When the radiant intensity ratio B/A is less than 1.0, it is assumed that there was sharp inclination in the thickness direction of the silicon wafer, thereby, the silicon wafers were cracked because of generation of stress.

When a greater value of B/A was taken, it is assumed that it is possible to heat the silicon wafer with slight temperature gradient in the thickness direction.

However, it is necessary to heat the silicon wafer to about 100 nm depth from the surface pf the silicon wafer to activate the impurities introduced by ionic implantation etc. However, in view of increasing a consumption rate of energy which is not necessary to heat the silicon wafer, it is not desirable to take into consideration, uniform heat of more than 100 nm depth from the surface of the silicon wafer. In this regard, the intensity ratio B/A is up to 5.0, optimally, 3.0.

In the case that the window member was not inserted between the flash lamp and the silicon wafer, in all the cases of the intensity ratio B/A, 0.8 to 5.0, the silicon wafers were cracked. This is because, in case that large emission energy was applied a shock wave was generated. The shock wave caused cracks of the silicon wafer. That is, even though the intensity ratio between the short wavelength area light and the long wavelength area light are taken into account, the silicon wafer is affected by the shock wave when large emission energy was applied to the flash lamp.

Thus, the present inventors discovered that the silicon wafer is affected by a shock wave (that is, wafer cracks), when light emission energy density on the exposed surface of the silicon wafer is more than 20 J/cm$^2$.

In the embodiment described above, although, to change the intensity ratio B/A, the materials of the arc tube and the thickness were changed, it is possible to use other parameters, such as gas pressure, kinds of noble gas, or energy applied to the flash lamp.

In the present invention, the short wavelength area is defined as 220 nm to 370 nm wavelength and the long wavelength area is defined as 370 nm to 800 nm. The effect of the present invention is obtained with the intensity ratio B/A that is 1.0 by using the wavelength 370 nm as a borderline. However, the technical idea of the present invention is to define the radiant intensity ratio between the short wavelength light absorbed near the wafer surface and long wavelength light reaching inside the silicon wafer.

Further, although in the apparatus shown in FIG. 1, the light-transmitting window is provided in the chamber having the stage, it is possible to provide a light-transmitting window in the casing having the flash lamp. Furthermore, it is possible to provide such light transmitting windows in both the chamber and the casing. A flash light is emitted for about 50 to 1000 μsec. In an actual operation, a flash light is emitted 1 to 10 times on the silicon wafer, typically, 5 times.

In the embodiment of the present invention, a plurality of flash lamps are provided and are flashed at the same time. In such case, the radiant spectrum thereof is not necessarily the same, but the ratio between the short wavelength and long wavelength on the exposed surface of the stage is an important factor.

Thus, in the light heating apparatus according to the present invention, upon one time flash of the flash lamp, the intensity ratio B/A on the stage surface is greater than 1.0 wherein the integrated radiant intensity in the range from 220 nm to 370 nm wavelength is represented A and the integrated radiant intensity in the range from 370 nm to 800 nm is represented as B.

Therefore, it is possible to uniformly adjust a light absorption rate in a surface portion (a portion near the surface) and a deep portion. Thereby, it is possible to well solve the problem that the silicon wafer is cracked because of stress inside the silicon wafer in the thickness direction.

Further, since airtight light transmitting member is inserted between the flash lamp and the stage surface, the silicon wafer is well heat-controlled without receiving a shock wave even though emission energy from the flash lamp is large.

The disclosure of Japanese Patent Application No. 2002-184226 filed on Jun. 25, 2002 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A light heating apparatus having a flash lamp, a casing surrounding the flash lamp, a stage where a substrate is placed, and a power feeding apparatus for controlling emission of light from the flash lamp, wherein a B/A is greater than 1.0 wherein integrated radiant intensity of the light in a range of 220 to 370 nm wavelength is represented as A and integrated radiant intensity of the light in a range of 370 to 800 nm wavelength is represented as B.

2. The light heating apparatus according to claim 1, the light on the flash lamp is emitted on the substrate through a light-transmitting member.

3. The light heating apparatus according to claim 1, further including a pre-heating lamp.

4. The light heating apparatus according to claim 2, wherein the light-transmitting member is airtight.

5. The light heating apparatus according to claim 2, wherein light emission density on the surface of the stage is more than 20 J/cm$^2$.

6. A light heating apparatus comprising:

a flash lamp that emits light on a substrate; and a stage where the substrate is placed, wherein a B/A is greater than 1.0 wherein integrated radiant intensity of the light in a range of 220 to 370 nm wavelength is represented as A and integrated radiant intensity of the light in a range of 370 to 800 nm wavelength is represented as B.

7. A method for emitting light on a substrate, composing the steps of:

placing a substrate on a predetermined place; and emitting light on the substrate;

wherein a B/A is greater than 1.0 wherein integrated radiant intensity of the light in a range of 220 to 370 nm wavelength is represented as A and integrated radiant intensity of the light in a range of 370 to 800 nm wavelength is represented as B.

8. The method for emitting light on a substrate according to claim 7, in the step of emitting light, the light passes through a light transmitting member.

9. The method for emitting light on a substrate according to claim 8, wherein light emission density on the substrate is more than 20 J/cm$^2$.

10. The method for emitting light on a substrate according to claim 7, further including a step of pre-heating the substrate.

* * * * *